(12) United States Patent
Tadepally et al.

(10) Patent No.: US 11,586,599 B1
(45) Date of Patent: Feb. 21, 2023

(54) SMART DATA WAREHOUSE PROTOCOLS

(71) Applicant: Bank of America Corporation, Charlotte, NC (US)

(72) Inventors: Ravikanth Tadepally, Hyderabad (IN); Suki Ramasamy, Chennai (IN); Mohan Sundaresan, Secunderabad (IN); Sreenivas Chintada, Chennai (IN)

(73) Assignee: Bank of America Corporation, Charlotte, NC (US)

( * ) Notice: Subject to any disclaimer, the term of this patent is extended or adjusted under 35 U.S.C. 154(b) by 0 days.

(21) Appl. No.: 17/523,994

(22) Filed: Nov. 11, 2021

(51) Int. Cl.
| | | |
|---|---|---|
| *G06F 16/00* | (2019.01) | |
| *G06F 16/215* | (2019.01) | |
| *G06F 16/25* | (2019.01) | |
| *G06F 16/2458* | (2019.01) | |
| *G06F 16/22* | (2019.01) | |
| *G06F 16/35* | (2019.01) | |
| *G06F 16/903* | (2019.01) | |
| *G06F 30/27* | (2020.01) | |
| *G06F 16/2455* | (2019.01) | |

(52) U.S. Cl.
CPC ........ *G06F 16/215* (2019.01); *G06F 16/2255* (2019.01); *G06F 16/2462* (2019.01); *G06F 16/254* (2019.01); *G06F 16/258* (2019.01); *G06F 16/35* (2019.01); *G06F 16/24564* (2019.01); *G06F 16/90344* (2019.01); *G06F 30/27* (2020.01)

(58) Field of Classification Search
CPC ............... G06F 16/215; G06F 16/2255; G06F 16/24564; G06F 16/2462; G06F 16/254; G06F 16/258; G06F 16/35; G06F 16/90344; G06F 30/27
See application file for complete search history.

(56) References Cited

U.S. PATENT DOCUMENTS

2020/0349165 A1* 11/2020 Park .................... G06F 16/2282

FOREIGN PATENT DOCUMENTS

| CN | 102414683 A | * | 4/2012 | ............ G06F 16/51 |
| CN | 108596271 A | * | 9/2018 | |
| CN | 113283973 A | * | 8/2021 | ............ G06F 16/51 |
| CN | 113807940 A | * | 12/2021 | |

* cited by examiner

*Primary Examiner* — Diedra McQuitery
(74) *Attorney, Agent, or Firm* — Weiss & Arons LLP

(57) ABSTRACT

Systems, methods and apparatus are provided for AI-based generation of data warehouse quality protocols. An attribute classifier may quantify relationships between source data and target data from an enterprise data warehouse. A data quality engine may apply these relationships to identify specific data quality concerns and generate customized data quality metrics. A user interface may enable a user to enter parameters for the classification protocols and corresponding rule-based generation of data quality metrics.

20 Claims, 8 Drawing Sheets

| Source Column | Match_Attribute_1 | Similarity Score 1 | Match_Attribute_2 | Similarity Score 2 | Match_Attribute_3 | Similarity Score 3 |
|---|---|---|---|---|---|---|
| ABC | XXX | 0.083388348 | XXX_XX_XXXX | 0.062112698 | XXX_XX_XXXX | 0.047599551 |
| DEF | No corresponding matching colums found | | | | | |
| GHI | XXXX_XX_XXXX | 0.5161291544 | XXX_XX_XXXX | 0.38941673 | XXX_XX_XXXX | 0.38941673 |
| JKL | XXX_XX_XXXX | 0.019 | XXX_XX_XXXX | 0.019 | XXX_XX_XXXX | 0.019 |
| MNO | XXX_XX_XXXX | 0.99 | XXX_XX_XXXX | 0.72 | XXX_XX_XXXX | 0.714 |
| PQR | XXX_XX_XXXX | 0.704 | XXX_XX_XXXX | 0.01 | XXX_XX_XXXX | |
| STU | XXX_XX_XXXX | 0.99 | XXX_XX_XXXX | 0.72 | XXX_XX_XXXX | 0.714 |
| VWX | XXX_XX_XXXX | 0.669281747 | XXX_XX_XXXX | 0.669281747 | XXX_XX_XXXX | 0.592983628 |
| YZA | XXX_XX_XXXX | 0.689232522 | XXX_XX_XXXX | 0.689232522 | XXX_XX_XXXX | 0.610660014 |
| BCD | XXX_XX_XXXX | 1 | XXX_XX_XXXX | 1 | XXX_XX_XXXX | 1 |

FIG. 8

SMART DATA WAREHOUSE PROTOCOLS

FIELD OF TECHNOLOGY

Aspects of the disclosure relate to protocols for AI-based data warehouse quality management.

BACKGROUND OF THE DISCLOSURE

Data quality management is crucial for a wide range of business intelligence functions such as reporting, analytical processing, performance management, benchmarking, and predictive analytics.

Business intelligence systems integrate data from a variety of heterogenous data sources. Data warehouse protocols process and store source data in a proprietary structured format.

Data quality management may ensure the reliability of the data warehouse. Data stored in the data warehouse may be subject to different data quality metrics based on the type of data and the parameters for the operations on the source data, but it can be difficult or impossible to manually capture these distinctions. The complexities of integrating upstream and downstream components with different data structures also make it difficult to define automated data quality protocols with the flexibility to address unique system architectures.

It would be desirable to use AI methods to quantify the relationships between heterogenous source data and structured target data. It would be desirable to apply these relationships to identify specific data quality concerns and generate customized data quality metrics. This data-agnostic approach would be uniformly applicable, but the incorporation of both source attributes and target attributes from a given system would uniquely customize the protocols for individual system architectures.

SUMMARY OF THE DISCLOSURE

Systems, methods, and apparatus for smart data warehouse protocols are provided.

A set of source attributes may be obtained from a data source. The source attributes may include unstructured, semi-structured or structured data. A set of target attributes may be obtained from a data warehouse. The target attributes may include structured enterprise data.

An attribute classifier may generate a hash from each attribute in the set of source attributes. The attribute classifier may generate a hash from each target attribute in the set of target attributes. The attribute classifier may determine a probability of correspondence between a source attribute hash and each of the target attribute hashes.

A data quality engine may classify a source attribute based at least in part on the probability of correspondence between the source attribute hash and a target attribute hash. The data quality engine may classify a target attribute based at least in part on a probability of correspondence between a source attribute hash and the target attribute hash. The data quality engine may generate data quality metrics for the source attributes and the target attributes based on the classifications. The data quality engine may validate the source data and the target data using the data quality metrics.

A user interface may enable selection of a source data set and a target data set. The user interface may enable selection of hashing parameters such as cardinality. The user interface may enable modification of rules for generating data quality protocols. The user interface may display one or more data quality reports.

BRIEF DESCRIPTION OF THE DRAWINGS

The objects and advantages of the disclosure will be apparent upon consideration of the following detailed description, taken in conjunction with the accompanying drawings, in which like reference characters refer to like parts throughout, and in which:

FIG. 8 shows an illustrative screen view in accordance with principles of the disclosure.

DETAILED DESCRIPTION

Figure 1:
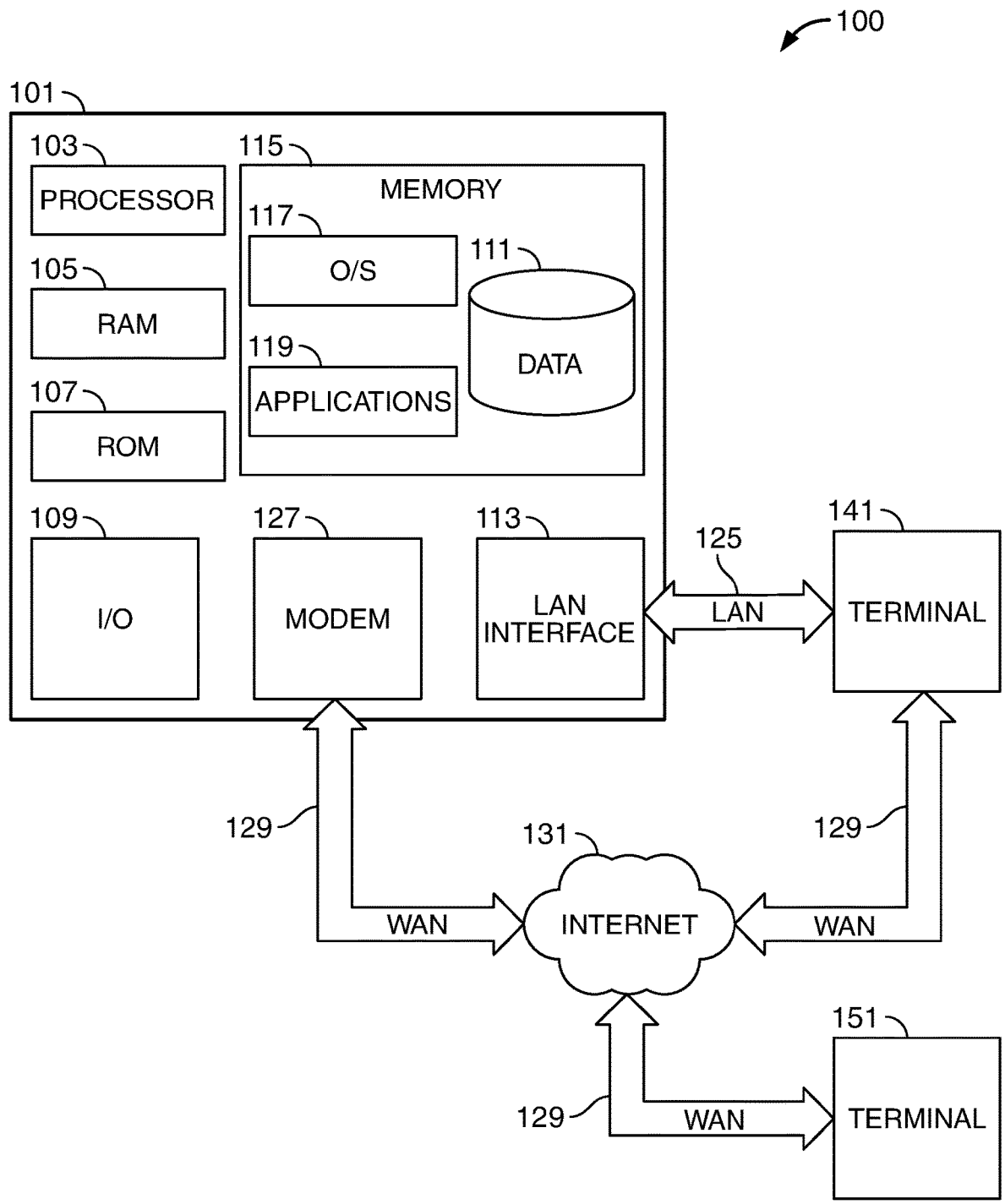
FIG. 1 shows illustrative apparatus in accordance with principles of the disclosure.

Systems, methods and apparatus for smart data warehouse protocols are provided.

Business intelligence (BI) may be defined as a set of tools and protocols for the transformation of raw data into meaningful and useful information for business analysis purposes. A BI system may combine data warehousing and decision support systems.

BI systems obtain data from a variety of heterogenous data sources. These disparate upstream systems may include SQL databases, non-SQL databases, message queues, websites, live data feeds, or any suitable source. Source data may be structured, semi-structured, or unstructured. A data warehouse functions as a centralized repository that integrates data from these different source formats.

Data warehouses are typically built using either extract, transform, load (ETL), or extract, load, transform (ELT) tools.

In an ETL-based data warehouse, a staging layer stores raw data extracted from each of the source data systems. An integration layer integrates the data sets by transforming the data from the staging layer. The integrated data is arranged into facts and hierarchical groups of dimensions.

Facts may be defined as quantitative values or measurements and are subject to aggregation. Dimensions may be qualitative and descriptive, and may provide information related to a fact. For example, in the case of transaction data, a fact column may include purchase amounts and a dimension column may include identifiers for customers associated with the purchases.

In a relational database, primary and foreign key attributes in the fact and dimension tables may include identifiers that establish relationships between tables. Primary and foreign key attributes may be subject to different data quality metrics.

ELT-based data warehousing does not typically use a separate tool for transformation. Instead, an ELT based system maintains a staging area inside the data warehouse itself. Data is extracted from heterogeneous source systems and then directly loaded into the data warehouse, before any transformation occurs. Transformations are then handled inside the data warehouse itself and the transformed data is loaded into target tables.

Source data integrated into a data warehouse may require additional operations to ensure data quality before it is suitable for business intelligence operations.

Conventionally, data quality tools require manual input to identify relevant metrics. Existing processes for capturing data quality metrics are not easily adapted to the complexity of BI architectures with numerous upstream and downstream systems. AI-based attribute classification may be applied to overcome these challenges. By developing quantified relationships between the source data and the target data, the disparate sources may be harnessed to the target data to inform data quality management protocols for both the source data and the target data.

AI-based solutions may include automated generation of data quality metrics for both the source data and target data. The AI-based system may classify attributes without manual intervention and may provide the flexibility to automate design for any BI environment.

AI-based solutions may use the source feed and the corresponding data warehouse target data as inputs and run them against an AI classifier engine. The classifier engine may group both the source and target attributes for more precise and flexible quality management. A customizable rules engine may run the attributes from each category against a set of predefined rules to generate data quality metrics for the entire BI system.

Illustrative aspects of data quality include accuracy, reliability, completeness, precision, timeliness, integrity, and confidentiality. Illustrative data quality metrics include ratio of data to errors, number of empty values, data time-to-value, data transformation error rate, and data storage costs.

For the sake of illustration, the invention will be described as being performed by a "system." The system may include one or more features of the apparatus and methods that are described herein and/or any other suitable device or approach.

The system may include one or more raw data sources. The data sources may incorporate structured data, semi-structured data, and/or unstructured data. The system may include one or more data warehouses. The data warehouse may store enterprise target data integrated from various data sources.

The source data may include one or more attributes. The target data in the data warehouse may include one or more attributes. An attribute may be defined as a database component, such as a column in a table. The attributes may be fact attributes or dimension attributes. The attributes may be primary key or foreign key attributes.

The system may include an attribute classifier. The attribute classifier may correlate raw source data in various formats with structured target data from the data warehouse. The attribute classifier may read the data from the source system. The attribute classifier may extract an attribute from the source data set. The attribute classifier may use a data hash generation engine to generate a hash for the source attribute.

The data hash generation engine may determine the cardinality of the attribute. Cardinality may refer to the uniqueness of the data values stored in a particular column in a database table. Lower cardinality may indicate a greater number of duplicated elements in a column. A column with the lowest possible cardinality would have the same value for every row.

The cardinality of an attribute may determine how the attribute is tokenized before hashing. The determination may depend on the cardinality of the source attribute meeting a predetermined threshold. If the cardinality of the attribute meets or exceeds a predetermined threshold, the data hash generation engine may apply a first k-shingle algorithm to the attribute text strings. K-shingles may also be known as shingles or k-grams. K-shingles may be sequences of k contiguous characters on the incoming string. If the cardinality of the attribute does not meet the predetermined threshold, the system may utilize a different k-shingle algorithm or any other suitable algorithm.

For example, a column including a list of names would have a higher cardinality and the text may be tokenized with a first k-shingle algorithm to enable comparison of text strings. Numbers and user defined attributes may be separated using a second k-shingle algorithm.

The k-shingle algorithm may generate a matrix arrangement of the shingles for each attribute. Each shingle may include a string of the length k. The shingle matrix may function as a representation of the attribute in shingle format.

The shingle matrix may be a sparse matrix. A hashing algorithm may be applied to compress the shingle matrix. Compression may reduce memory overhead and enable rapid comparison of source attributes to target attributes. A MinHash algorithm may involve permutation of the shingle matrix to generate a MinHash signature. The MinHash signature may be a dense matrix. The MinHash signature may compresses the attribute while still functioning as a representation of the attribute for comparison purposes.

The attribute classifier may generate a unique source attribute MinHash signature matrix for each attribute in the source data set using the data hash generation engine. The attribute classifier may generate a unique target attribute MinHash signature matrix for each attribute in the target data set using the data hash generation engine.

The attribute classifier may compare a source attribute signature matrix against each of the target attribute signature matrices. The attribute classifier may use Jaccard similarity or any suitable distance algorithm to compare the hashes.

In order to identify attributes with a threshold level of Jaccard similarity, the attribute classifier may use locally sensitive hashing (LSH). LSH may use the MinHash signatures to identify compatible pairs with a similarity greater than the threshold. A signature matrix may be divided into bands which are each hashed to a specified number of buckets. Similar attributes will appear as a candidate pair in at least one of the bands. Using multiple hash functions reduces the time required for comparison, enabling an approximation based on whether a pair of attributes hashes into the same bucket for at least one of the hash functions. LSH may produce an accurate estimation of Jaccard similarity.

The attribute classifier may tune the size of the signature matrix, the size of the bands, the number of rows in each band, the threshold similarity, and any other suitable factor to capture most of the attribute pairs with similar signatures and eliminate most of the attribute pairs that do not have similar signatures.

The attribute classifier may check the original shingle sets for each of the candidate pairs to confirm a determination of similarity that was obtained through the MinHash and LSH operations.

For each source attribute, the attribute classifier may determine a set of target attributes with the highest probability of correspondence. Correspondence may be a percentage correspondence. Correspondence may be based on the threshold similarity of a candidate pair as determined using LSH. In some embodiments the attribute classifier may extract the top three target attributes.

The system may include a data quality engine. The data quality engine may read the attribute data from the attribute classifier. The data quality engine may determine if the attribute is a source attribute or a target attribute.

If the attribute is a source attribute, the data quality engine may determine whether the source attribute is used by enterprise systems. If the source attribute was classified as having a probable correspondence to a target attribute, the source attribute is determined to be used in the data warehouse. If the source attribute does not correspond to any target attributes, then the source attribute is not being used for enterprise business intelligence purposes.

Unused attributes may indicate enterprise spending on data that is not relevant for busines intelligence. The system may generate an unused attribute report, cataloging source attributes that are unused.

The system may generate data quality metrics for used source attributes. For example, source attributes may be evaluated for completeness, by determining null validations. Data quality metrics may validate the source attribute for compliance with business rules.

The data quality engine may identify input data as a target attribute. Target attributes may be classified based on their degree of correspondence to source attributes. A first category of target attributes may each correlate completely with a source attribute. These direct load attributes have a 100% probability of correspondence. If the direct load target attribute is a dimension, the data quality engine may generate data quality metrics based on the rules for dimensions. If the direct load target attribute is a fact, the data quality engine may generate data quality metrics based on the rules for facts.

A second category of target attributes may include transformations that only partially correlate with source attributes. Transformed target attributes have less than 100% probability of correspondence. If the transformed target attribute is a dimension, the data quality engine may generate data quality metrics based on the rules for dimensions. If the transformed target attribute is a fact, the data quality engine may generate data quality metrics based on the rules for facts.

A third category of target attributes may be primary keys and foreign keys. A foreign key may also be known as a reference key. The system may use metadata matches to identify primary keys and foreign keys. If the target attribute is a primary key or foreign key, the data quality engine may generate data quality metrics based on the rules for these keys.

The rules applied to generate data quality metrics for each attribute classification may be predefined. The predefined rules may be customized for given attribute classifications on an ongoing basis.

The system may include a user interface. The user interface may include a browser-based front end for inputing or selecting values. The user interface may automatically map the source feeds to the corresponding target system.

The user interface may enable a user to select a source data set and a target data set. The user interface may enable a user to enter source details, target details, and/or metadata for the data warehouse environment. A user may use the interface to specify parameters of the hashing algorithms. For example, a user may adjust the determination of cardinality to change the percentage of distinct values for an attribute that triggers a particular k-shingle algorithm. The user may specify the number of characters in each shingle. The user may specify a threshold level of similarity for identifying candidate pairs using the LSH algorithm.

One or more non-transitory computer-readable media storing computer-executable instructions are provided. When executed by a processor on a computer system, the instructions perform a method for AI based generation of data quality metrics for an enterprise data warehouse.

The method may include generating a source attribute hash from each source attribute obtained from one or more data sources and a target attribute hash from each target attribute in a set of target attributes. The set of target attributes may include data from one or more data sources that has been integrated into enterprise data warehouse structure.

The method may include determining a probability of correspondence between a source attribute hash and each of the target attribute hashes.

The method may include classifying a source attribute based at least in part on the probability of correspondence between the source attribute hash and a target attribute hash. The method may include classifying a target attribute based at least in part on the probability of correspondence between a source attribute hash and the target attribute hash.

The method may include generating data quality metrics for the source attribute and the target attribute based at least in part on the classifications. The method may include validating the source attribute data and the target attribute data using the data quality metrics.

The method may include interacting with a user interface to select a source data set and a target data set. The user interface may receive selection of program parameters such as a cardinality threshold or a threshold similarity between attribute hashes. The user interface may display one or more data quality reports based on application of the generated data quality metrics.

Systems, methods, and apparatus in accordance with this disclosure will now be described in connection with the figures, which form a part hereof. The figures show illustrative features of apparatus and method steps in accordance with the principles of this disclosure. It is to be understood that other embodiments may be utilized, and that structural, functional and procedural modifications may be made without departing from the scope and spirit of the present disclosure.

The steps of methods may be performed in an order other than the order shown and/or described herein. Method embodiments may omit steps shown and/or described in connection with illustrative methods. Method embodiments may include steps that are neither shown nor described in connection with illustrative methods. Illustrative method steps may be combined. For example, an illustrative method may include steps shown in connection with any other illustrative method.

Apparatus may omit features shown and/or described in connection with illustrative apparatus. Apparatus embodiments may include features that are neither shown nor described in connection with illustrative apparatus. Features of illustrative apparatus may be combined. For example, an illustrative apparatus embodiment may include features shown or described in connection with another illustrative apparatus/method embodiment.

FIG. 1 shows illustrative apparatus 100 that may be configured in accordance with the principles of the invention. FIG. 1 is a block diagram that illustrates a computing device 101 (alternatively referred to herein as a "server or computer") that may be used in accordance with the principles of the invention. The computer server 101 may have a processor 103 for controlling overall operation of the server and its associated components, including RAM 105, ROM 107, input/output ("I/O") module 109, and memory 115.

I/O module 109 may include a microphone, keypad, touchscreen and/or stylus through which a user of device 101 may provide input, and may also include one or more of a speaker for providing audio output and a video display device for providing textual, audiovisual and/or graphical output. Software may be stored within memory 115 and/or other storage (not shown) to provide instructions to processor 103 for enabling server 101 to perform various functions. For example, memory 115 may store software used by server 101, such as an operating system 117, application programs 119, and an associated database.

Alternatively, some or all of computer executable instructions of server 101 may be embodied in hardware or firmware (not shown).

Server 101 may operate in a networked environment supporting connections to one or more remote computers, such as terminals 141 and 151. Terminals 141 and 151 may be personal computers or servers that include many or all of the elements described above relative to server 101. The network connections depicted in FIG. 1 include a local area network (LAN) 125 and a wide area network (WAN) 129, but may also include other networks.

When used in a LAN networking environment, computer 101 is connected to LAN 125 through a network interface or adapter 113.

When used in a WAN networking environment, server 101 may include a modem 127 or other means for establishing communications over WAN 129, such as Internet 131.

It will be appreciated that the network connections shown are illustrative and other means of establishing a communications link between the computers may be used. The existence of any of various well-known protocols such as TCP/IP, Ethernet, FTP, HTTP and the like is presumed, and the system may be operated in a client-server configuration to permit a user to retrieve web pages from a web-based server. Any of various conventional web browsers may be used to display and manipulate data on web pages.

Additionally, application program 119, which may be used by server 101, may include computer executable instructions for invoking user functionality related to communication, such as email, short message service (SMS), authentication services and voice input and speech recognition applications.

Computing device 101 and/or terminals 141 or 151 may also be mobile terminals including various other components, such as a battery, speaker, and antennas (not shown). Terminal 151 and/or terminal 141 may be portable devices such as a laptop, tablet, smartphone or any other suitable device for receiving, storing, transmitting and/or displaying relevant information.

Any information described above in connection with database 111, and any other suitable information, may be stored in memory 115. One or more of applications 119 may include one or more algorithms that encrypt information, process received executable instructions, interact with enterprise systems, perform power management routines or other suitable tasks. Algorithms may be used to perform the functions of one or more of attribute classification, generation of attribute hashes, generation of data quality metrics, data quality validation, and/or perform any other suitable tasks.

The invention may be operational with numerous other general purpose or special purpose computing system environments or configurations. Examples of well-known computing systems, environments, and/or configurations that may be suitable for use with the invention include, but are not limited to, personal computers, server computers, hand-held or laptop devices, tablets, mobile phones and/or other personal digital assistants ("PDAs"), multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

Figure 2:
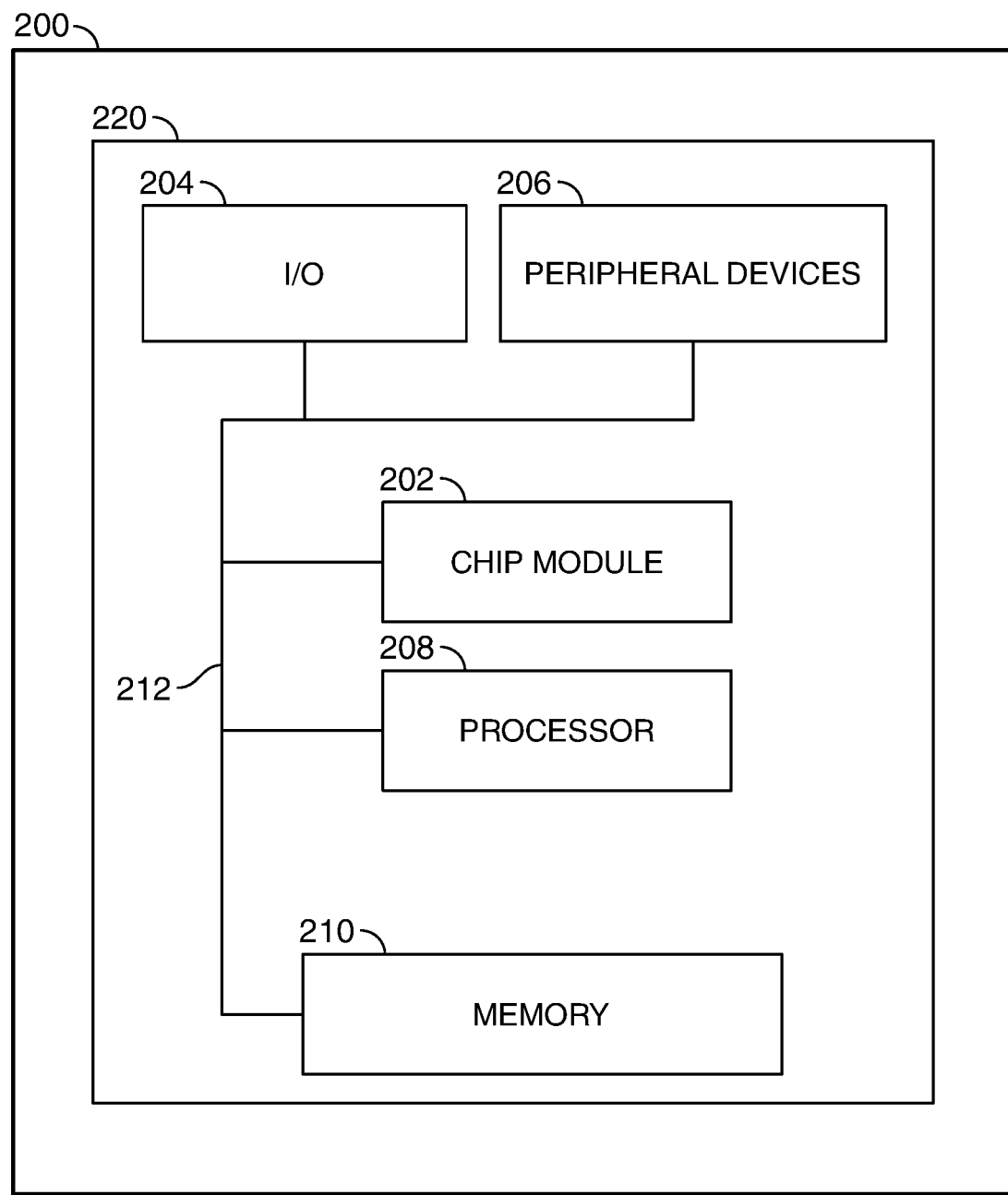
FIG. 2 shows illustrative apparatus in accordance with principles of the disclosure.

FIG. 2 shows an illustrative apparatus 200 that may be configured in accordance with the principles of the invention.

Apparatus 200 may be a computing machine. Apparatus 200 may include one or more features of the apparatus that is shown in FIG. 1.

Apparatus 200 may include chip module 202, which may include one or more integrated circuits, and which may include logic configured to perform any other suitable logical operations.

Apparatus 200 may include one or more of the following components: I/O circuitry 204, which may include a transmitter device and a receiver device and may interface with fiber optic cable, coaxial cable, telephone lines, wireless devices, PHY layer hardware, a keypad/display control device or any other suitable encoded media or devices; peripheral devices 206, which may include counter timers, real-time timers, power-on reset generators or any other suitable peripheral devices; logical processing device 208, which may hash attributes, generate candidate pairs of attributes, generate data quality metrics, validate data quality, and perform other methods described herein; and machine-readable memory 210.

Machine-readable memory 210 may be configured to store in machine-readable data structures: source attribute sets, target attribute sets, source attribute hashes, target attribute hashes, probable attribute matches, attribute classification, rules for different classifications, data quality metrics, validation results and any other suitable information or data structures.

Components 202, 204, 206, 208 and 210 may be coupled together by a system bus or other interconnections 212 and may be present on one or more circuit boards such as 220. In some embodiments, the components may be integrated into a single chip. The chip may be silicon-based.

Figure 3:
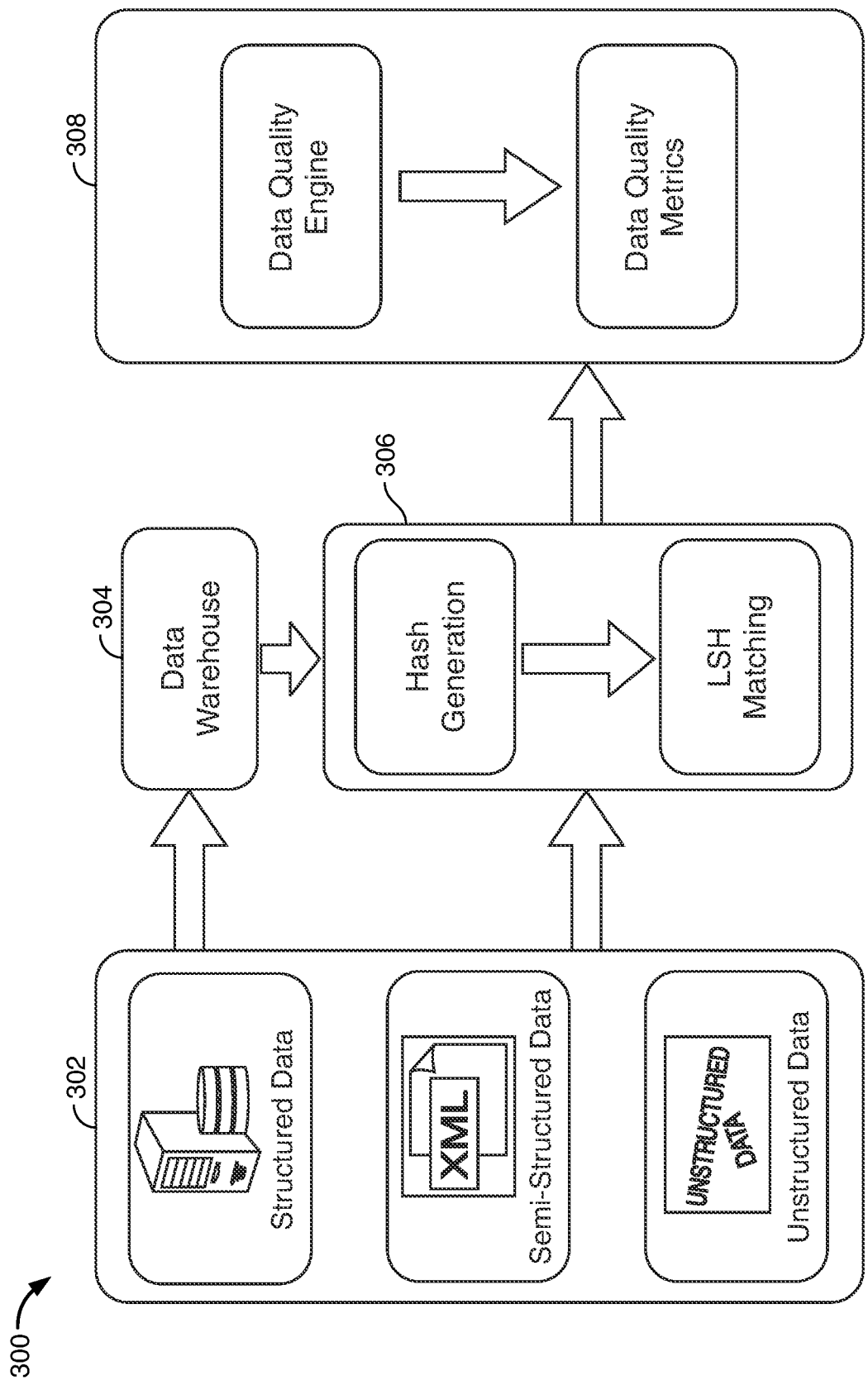
FIG. 3 shows illustrative system architecture in accordance with principles of the disclosure.

FIG. 3 shows high-level system overview 300. Sources 302 regularly provide raw source data for data warehouse 304. Sources 302 may encompass a variety of different data architectures. Data warehouse 304 may integrate the raw source data into a highly structured format according to enterprise standards.

Attribute classifier 306 may receive source attributes from sources 302 and target attributes from data warehouse 304. Attribute classifier 306 may generate hashes for each source attribute and target attribute. Attribute classifier 306 may use an LSH scheme to pair a source attribute and a target attribute based on the correspondence between the hashes.

Data quality manager 308 may receive the attributes and attribute classification data from attribute classifier 306. Based on the data from the attribute classifier, a data quality engine may identify whether source attributes are used or unused and whether target attributes are identical to the source data, transformed from the source data or functioning as primary or reference keys. The data quality engine may determine whether identical and transformed target attributes are facts or dimensions. The data quality engine may generate data quality metrics that are customized for each attribute classification. The data quality engine may validate each attribute using a customized data quality metric.

Figure 4:
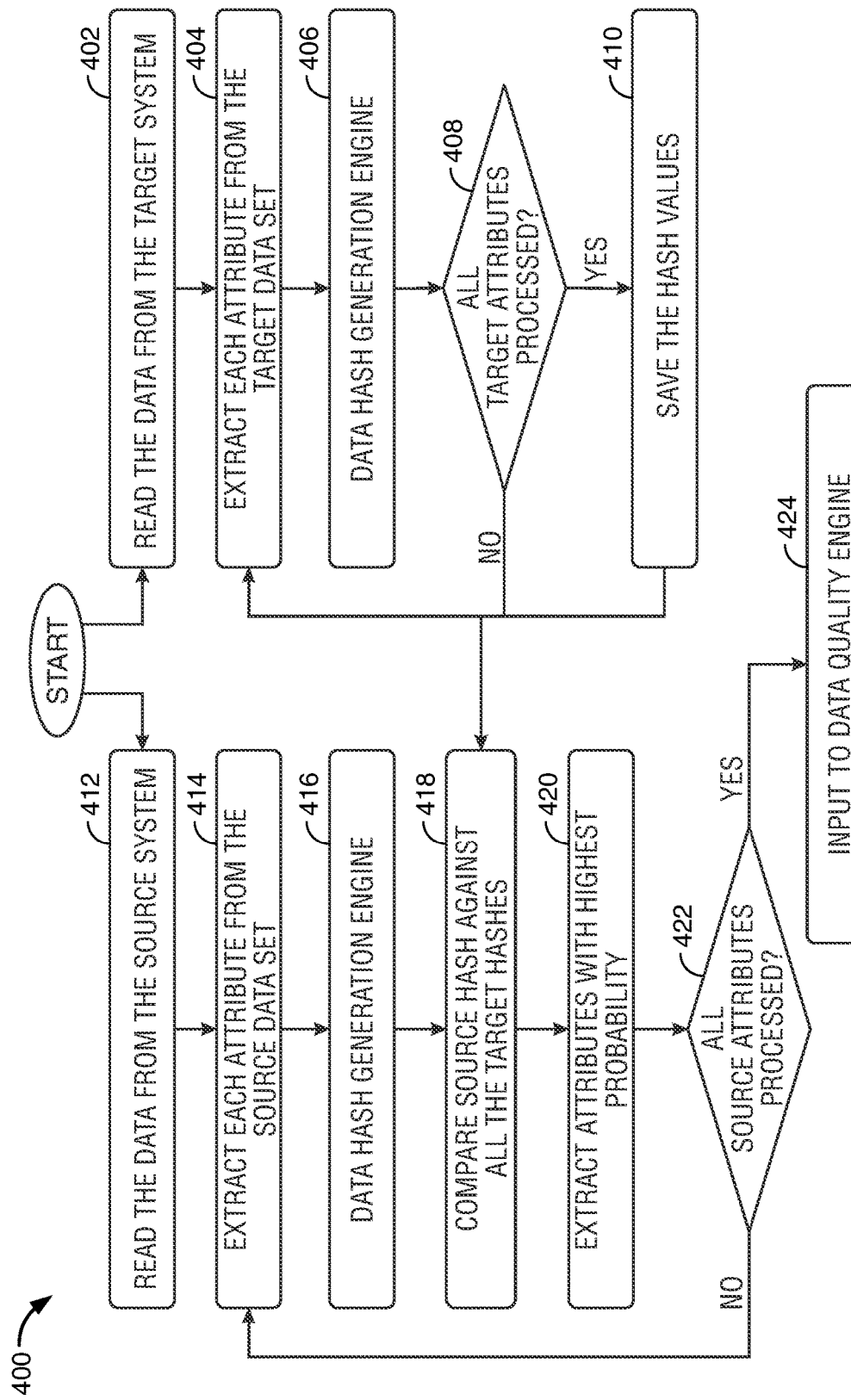
FIG. 4 shows an illustrative process flow in accordance with principles of the disclosure.

FIG. 4 shows illustrative process flow 400 for an attribute classifier. Steps 402-410 show processing of target attributes. At step 402, the attribute classifier reads data from the target system. The target system may be an enterprise data warehouse. At step 404, the attribute classifier extracts each attribute from the target data set. At step 406, the data hash generation engine generates a hash for each of the target attributes. The data hash generation engine is shown in more detail in FIG. 5. At step 408, the process iterates until all of the extracted target attributes are processed. At step 410, the attribute classifier saves the target attribute hash values for use in step 418.

Steps 412-424 show processing of source attribute data. At step 412, the attribute classifier reads data from the source system. At step 414, the attribute classifier extracts each attribute from the source data set. At step 416 a data hash generation engine generates a hash for each of the source attributes. The data hash generation engine is shown in more detail in FIG. 5. At step 418, the attribute classifier compares a source attribute hash against each of the target attribute hashes. The comparison may include a determination of Jaccard similarity, Jaccard distance, or any suitable method. At step 420 a set of target attributes with the highest probability of a match to the source attribute are extracted. At step 422, the process iterates until all of the extracted source attributes are processed. At step 424, results from the attribute classifier are input to a data quality engine. The data quality engine is shown in more detail in FIG. 6.

Figure 5:
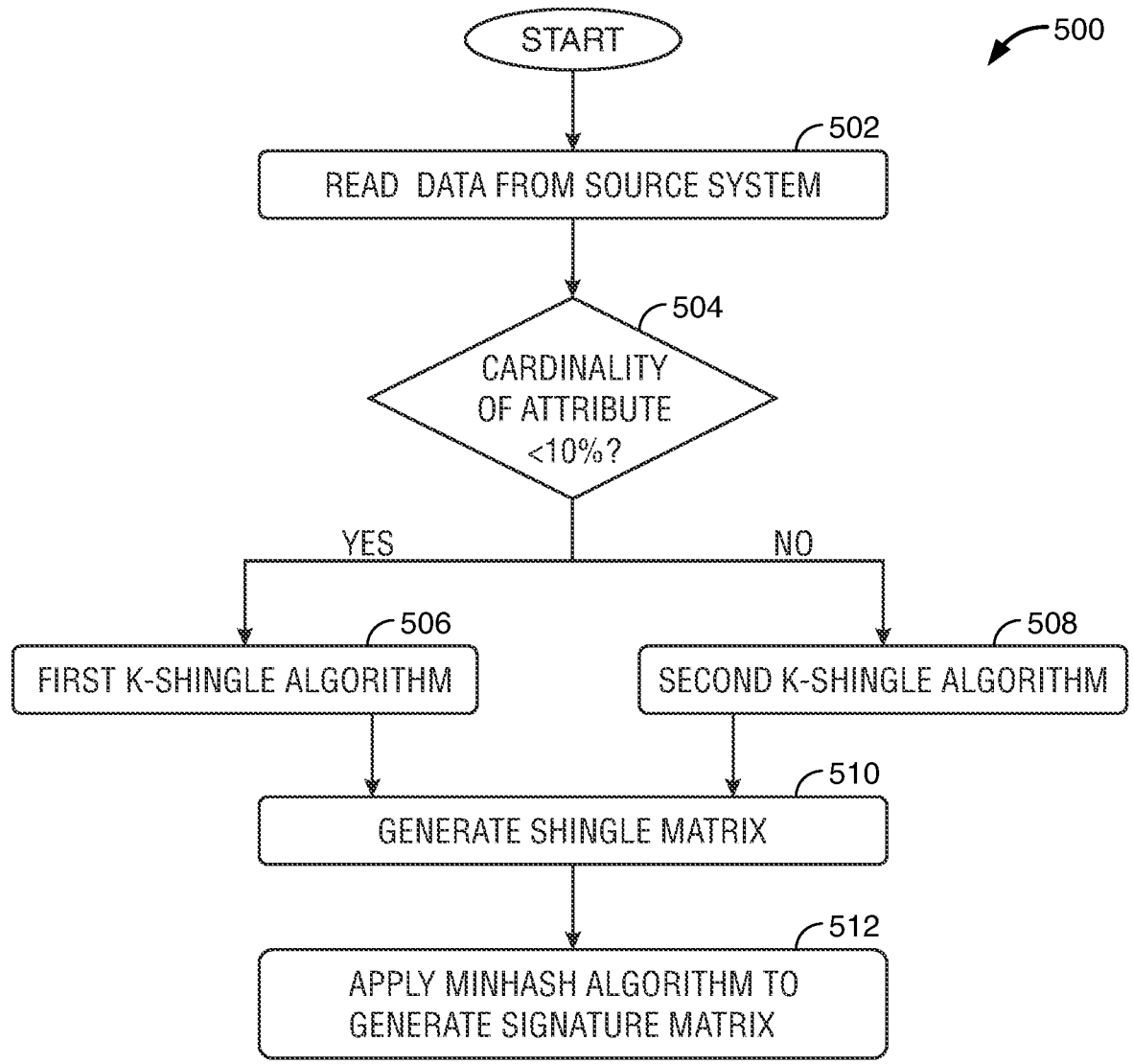
FIG. 5 shows an illustrative process flow in accordance with principles of the disclosure.

FIG. 5 shows illustrative process flow 500 for a data hash generation engine. One or more elements of process flow 500 may overlap with elements of process flow 400, shown in FIG. 4.

Process flow 500 shows generation of a MinHash signature, but any suitable hashing algorithm may be used. Process flow 500 shows processing of a source attribute, but the hashing process may also be applied to target attributes, as shown in FIG. 4 at step 406.

At step 502, the data hash generation engine reads attribute data from the source system. At step 504, the cardinality of the attribute is determined. If the cardinality of the attribute meets a predetermined threshold, the process continues at step 506 with a first k-shingle algorithm. If the cardinality of the attribute is below the predetermined threshold, the process continues at step 508 with a second k-shingle algorithm. At step 510, the data hash generation algorithm generates a shingle matrix. At step 512, the data hash generation engine applies a MinHash function to generate a MinHash signature matrix for the source attribute to use for comparison.

Figure 6:
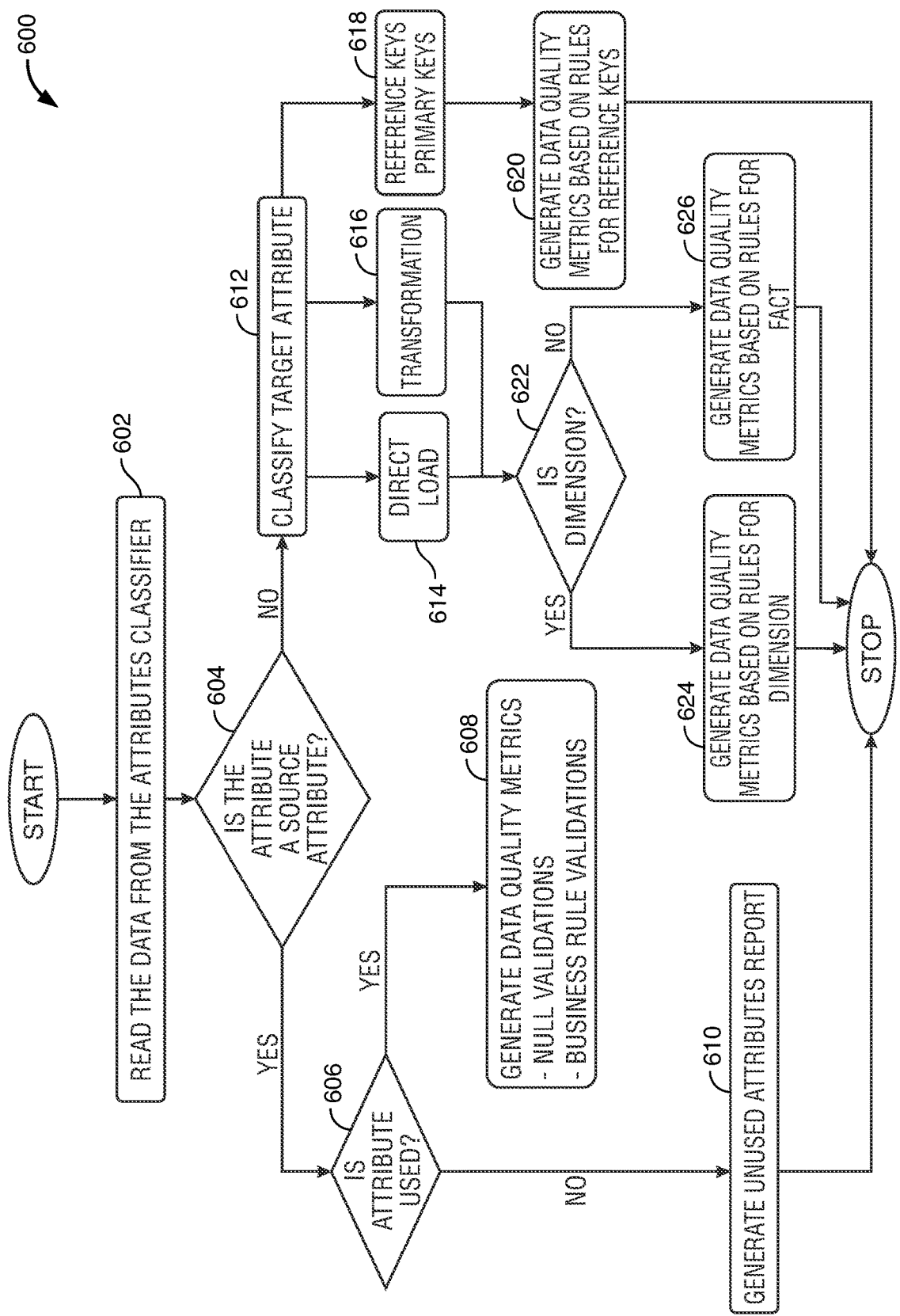
FIG. 6 shows an illustrative process flow in accordance with principles of the disclosure.

FIG. 6 shows illustrative process flow 600 for a data quality engine. One or more elements of process flow 600 may overlap with elements of process flow 400, shown in FIG. 4, and process flow 500, shown in FIG. 5.

At step 602 the data quality engine reads the data from the attribute classifier. At step 604, the data quality engine determines whether an attribute is a source attribute or target attribute. If the attribute is a source attribute, the process continues with steps 606-610. If the attribute is a target attribute, the process continues with steps 612-626.

At step 606, the data quality engine determines if the attribute is used. The determination is based on the probability of a match to a target attribute determined by the attribute classifier. If the probability is below a predetermined threshold, indicating no match to structures in the data warehouse, the attribute is determined to be unused.

If the attribute is unused, the process continues at step 610. At step 610, the data quality engine generates an unused attribute report. If the attribute is used, the process continues at step 608. At step 608 the data quality engine generates data quality metrics for the source attribute. Illustrative data quality metrics include null validations to check for completeness and business rule validations to check for compliance with enterprise standards.

If the attribute is a target attribute, at step 612, the data quality engine buckets the target attribute based on its relationship to the source attribute. At step 614, the target attribute entirely matches the source attribute and is bucketed as a direct load. At step 616, the target attribute is related to the source attribute, but has undergone some transformation. These attributes have a percentage match to the source attribute that is less than 100% and are bucketed as transformations. At step 618, the target attribute is identified as reference key or primary key. At step 620, the data quality engine generates data quality metrics based on the rules for reference keys.

If the target attribute is determined to be a direct load or a transformation, the process continues at steps 622-626. At step 622 the data quality engine determines whether the direct load attributes and the transformation attributes are dimensions or facts. If the attribute is a dimension, the process continues at step 624. At step 624, the data quality engine generates data quality metrics based on rules for dimensions. If the attribute is not a dimension, the process continues at step 626. At step 626, the data quality engine generates data quality metrics based on rules for facts.

Figure 7:
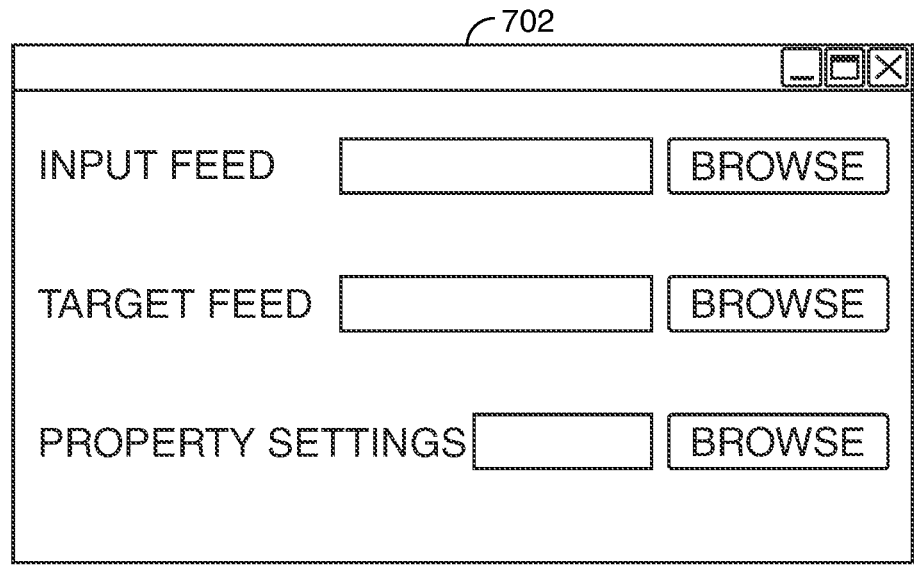
FIG. 7 shows illustrative screen views in accordance with principles of the disclosure.

FIG. 7 shows screen views 702 and 704 of a user interface. An AI-based tool for generating data quality protocols may include a user interface configured to accept input parameters from a user. At screen 702, the user may specify a source data set and a target data set. The user may specify program parameters, such as cardinality thresholds, Jaccard similarity thresholds, LSH compatibility thresholds, classification rules, data quality metric rules, or any suitable parameters.

At screen 704, the user may view and adjust determinations of cardinality for each attribute. The cardinality of an attribute may be determined by the system by any suitable method. At screen 704, the system displays cardinality as well as a determination of whether the attribute meets a predetermined threshold cardinality. The system determination of whether each attribute meets the threshold may be overridden by the user via input to the user interface.

FIG. 8 shows screen view 802. Screen 802 may be displayed on the user interface. Screen 802 includes a table showing a source attribute along with the three target attributes having the highest percentage match to the source attribute. The percentage match for each of the three target attributes is also shown in the table.

Thus, methods and apparatus for SMART DATA WAREHOUSE PROTOCOLS are provided. Persons skilled in the art will appreciate that the present invention can be practiced by other than the described embodiments, which are presented for purposes of illustration rather than of limitation, and that the present invention is limited only by the claims that follow.

What is claimed is:

1. A method for interactive AI-based generation of data warehouse quality protocols, the method comprising:
   receiving, at a user interface, a set of source attributes obtained from one or more data sources and a set of target attributes comprising target data from a data warehouse;
   generating a source attribute hash from each attribute in the set of source attributes;
   generating a target attribute hash from each attribute in the set of target attributes;
   classifying a source attribute based at least in part on a probability of correspondence between the source attribute hash and one of the target attribute hashes;
   classifying the target attribute based at least in part on a probability of correspondence between the target attribute hash and one of the source attribute hashes;
   generating a first data quality metric based at least in part on the source attribute classification;
   generating a second data quality metric based at least in part on the target attribute classification;
   validating the set of source attributes using the first data quality metric and the set of target attributes using the second data quality metric; and
   displaying a data quality report on the user interface, the data quality report based in part on the validating the set of source attributes and the set of target attributes.

2. The method of claim 1, wherein:
   the data quality metrics are based on one or more predefined rules associated with an attribute classification; and
   the user interface is further configured to receive input modifying the predefined rules.

3. The method of claim 1, further comprising:
   determining whether a cardinality of the attribute meets a predetermined threshold;
   when the cardinality of the attribute meets the threshold, using a first k-shingles algorithm to generate a set of shingles for the attribute; and
   when the cardinality of the attribute does not meet the threshold, using a second k-shingles algorithm to generate a set of shingles for the attribute.

4. The method of claim 1, wherein classifying an attribute comprises:
   generating a set of shingles for the attribute;
   generating a signature matrix for each shingle set using a MinHash algorithm; and
   using a locally sensitive hashing algorithm, identifying a candidate pair comprising a source attribute and a target attribute based on the signature matrices for the each attribute.

5. The method of claim 1, wherein classifying the target attribute comprises determining whether the target attribute is a transformation of the source attribute, the determination based on a relationship between the target attribute hash and the source attribute hash.

6. The system of claim 1, wherein classifying the source attribute comprises determining whether the source attribute is used or unused, the determination based on a relationship between the target attribute hash and the source attribute hash, wherein a source attribute is unused when the probability of correspondence between the source attribute hash and each of the target attribute hashes is below a predetermined threshold.

7. The method of claim 1, wherein the source attribute comprises semi-structured or unstructured data and the target attribute comprises structured data.

8. One or more non-transitory computer-readable media storing computer-executable instructions which, when executed by a processor on a computer system, perform a method for AI-based generation of data warehouse quality protocols, the method comprising:
   receiving, at a user interface, a set of source attributes obtained from one or more data sources and a set of target attributes comprising target data obtained from one or more data sources and integrated into a data warehouse;
   generating a source attribute hash from each attribute in the set of source attributes;
   generating a target attribute hash from each attribute in the set of target attributes;
   identifying a candidate pair comprising a source attribute and a target attribute based at least in part on the source attribute hash generated from the source attribute and the target attribute hash generated from the target attribute;
   classifying the source attribute based at least in part on a probability of correspondence for the candidate pair source attribute and the candidate pair target attribute;
   classifying the target attribute based at least in part on a probability of correspondence for the candidate pair source attribute and the candidate pair target attribute;
   generating a first data quality metric for the source attribute based at least in part on the source attribute classification;
   generating a second data quality metric for the target attribute based at least in part on the target attribute classification;
   validating the source attribute using the first data quality metric and the target attribute using the second data quality metric; and
   displaying a data quality report on the user interface, the data quality report based at least in part on validating the source attribute using the first data quality metric and the target attribute using the second data quality metric.

9. The media of claim 8, wherein:
   the data quality metrics are based on one more predefined rules for an attribute classification; and
   the user interface is further configured to receive input modifying the predefined rules.

10. The media of claim 8, the method further comprising:
    determining whether a cardinality of an attribute meets a predetermined threshold;
    when the cardinality of the attribute meets the threshold, using a first k-shingles algorithm to generate a set of shingles for the attribute; and
    when the cardinality of the attribute does not meet the threshold, using a second k-shingles algorithm to generate a set of shingles for the attribute.

11. The media of claim 8, wherein classifying an attribute comprises:
   generating a set of shingles from the attribute;
   generating a signature matrix for each shingle set using a MinHash algorithm;
   using a locally sensitive hashing algorithm, identifying a candidate pair based on the signature matrices for each attribute.

12. The media of claim 8, wherein classifying the target attribute comprises determining whether the target attribute is a transformation of the source attribute, the determination based on a relationship between the target attribute hash and the source attribute hash.

13. The media of claim 8, wherein the source attributes comprise semi-structured or unstructured data and the target attributes comprise structured data.

14. A system for interactive generation of data warehouse quality protocols, the system comprising:
   a data source comprising a set of source attributes;
   a data warehouse comprising target data obtained from one or more data sources, the target data comprising a set of target attributes;
   a processor configured to:
      generate a source attribute hash from a source attribute in the set of source attributes;
      generate a target attribute hash from a target attribute in the set of target attributes;
      classify the source attribute based at least in part on a probability of correspondence between the source attribute hash and the target attribute hash;
      classify the target attribute based at least in part on a probability of correspondence between the source attribute hash and the target attribute hash;
      generate a first data quality metric for the source attribute, the first data quality metric based at least in part on the source attribute classification;
      generate a second data quality metric for the target attribute, the second data quality metric based at least in part on the target attribute classification; and
      validate the source attribute using the first data quality metric and the target attribute using the second data quality metric; and
   a user interface configured to:
      receive input of the set of source attributes and the set of target attributes; and
      display one or more data quality outcomes, the data quality outcomes based at least in part on validating the source attribute using the first data quality metric and the target attribute using the second data quality metric.

15. The system of claim 14, wherein:
   the processor is further configured to generate the first data quality metric and the second data quality metric based on one or more predefined rules associated with an attribute classification; and
   the user interface is further configured to receive input modifying the predefined rule.

16. The system of claim 14, wherein the processor is configured to apply a cardinality threshold for an attribute, wherein:
   when the cardinality of the attribute meets the threshold, the processor is configured to use a first k-shingle algorithm to generate a first shingle set from the attribute; and
   when the cardinality of the attribute does not meet the threshold, the processor is configured to use a second k-shingle algorithm to generate a second shingle set from the attribute.

17. The system of claim 14, wherein the processor is configured to:
   generate a set of shingles for an attribute;
   generate a signature matrix for each shingle set using a MinHash algorithm; and
   using a locally sensitive hashing algorithm, identify a candidate pair comprising a source attribute and a target attribute based on the signature matrices for each attribute.

18. The system of claim 15, wherein classifying the target attribute comprises determining whether the target attribute is a transformation of the source attribute, the determination based on a relationship between the target attribute hash and the source attribute hash.

19. The system of claim 15, wherein classifying the source attribute comprises determining whether the source attribute is used or unused, the determination based on a relationship between the target attribute hash and the source attribute hash, wherein a source attribute is unused when the probability of correspondence between the source attribute hash and each of the target attribute hashes is below a predetermined threshold.

20. The system of claim 15 wherein the source attribute and the target attribute comprise different data structures.

* * * * *